US005382845A

United States Patent [19]

Takahashi

[11] Patent Number: 5,382,845
[45] Date of Patent: Jan. 17, 1995

[54] ECL TO CMOS LEVEL CONVERTER

[75] Inventor: Hiroyuki Takahashi, Tokyo, Japan

[73] Assignee: NEC Corporation, Tokyo, Japan

[21] Appl. No.: 961,865

[22] Filed: Oct. 15, 1992

[30] Foreign Application Priority Data

Oct. 25, 1991 [JP] Japan .................... 3-305684

[51] Int. Cl.$^6$ .......................... H03K 9/0175
[52] U.S. Cl. ...................... 326/66; 326/110; 327/51
[58] Field of Search ............ 307/475, 451, 446, 455

[56] References Cited

U.S. PATENT DOCUMENTS

| | | | |
|---|---|---|---|
| 5,039,886 | 8/1991 | Nakamura et al. | 307/475 |
| 5,070,261 | 12/1991 | Teneyck | 307/475 |
| 5,075,579 | 12/1991 | Ueno | 307/475 |
| 5,214,328 | 5/1993 | Ohi | 307/475 |

FOREIGN PATENT DOCUMENTS 0417786 9/1990 European Pat. Off. .

OTHER PUBLICATIONS

M. Suzuki et al., "High-Speed SRAMs", ISSCC Digest of Technical Papers, 1989, pp. 32–33.

Stephen Flannagan et al., "Static RAMs", ISSCC Digest of Technical Papers, 1990, pp. 134–135.

Primary Examiner—Edward P. Westin
Assistant Examiner—Andrew Sanders
Attorney, Agent, or Firm—Sughrue, Mion, Zinn, Macpeak & Seas

[57] ABSTRACT

It is an object of the present invention to provide an amplifier circuit for amplifying the voltage amplitude of a small amplitude signal to the CMOS level which operates at a high speed with low power dissipation while assuring high gain. PMOS FETs $M_{11}$, $M_{16}$ for pulling up the output are of the source-driving type and receive signals $V_{IN1}$, $V_{IN1i}$, respectively, and NMOS FETs $M_{12}$, $M_{17}$ for pulling down the output are of the gate-driving type and receive level shifted signals $V_{IN2}$, $V_{IN2i}$, respectively. In the circuit of the present invention, constant voltages for reference are set by diodes $D_{13}$, $D_{14}$, and bipolar transistors are connected as transistors for driving an output portion of the amplifier circuit. The performance of the amplifier circuit of the invention when it is used as a sensing amplifier to drive a TTL output is improved such that amplification gain is as high as two to five times and the response time/-consumed current product is as low as one fifth to one tenth as compared with a conventional amplifier circuit.

20 Claims, 10 Drawing Sheets

FIG.16

ECL TO CMOS LEVEL CONVERTER

BACKGROUND OF THE INVENTION

1. Field of the Invention

This invention relates to a semiconductor circuit, and more particularly to an amplifier circuit for amplifying a voltage signal.

2. Description of the Related Art

Conventional amplifier circuits are utilized in various portions of semiconductor circuits.

Figure 1:
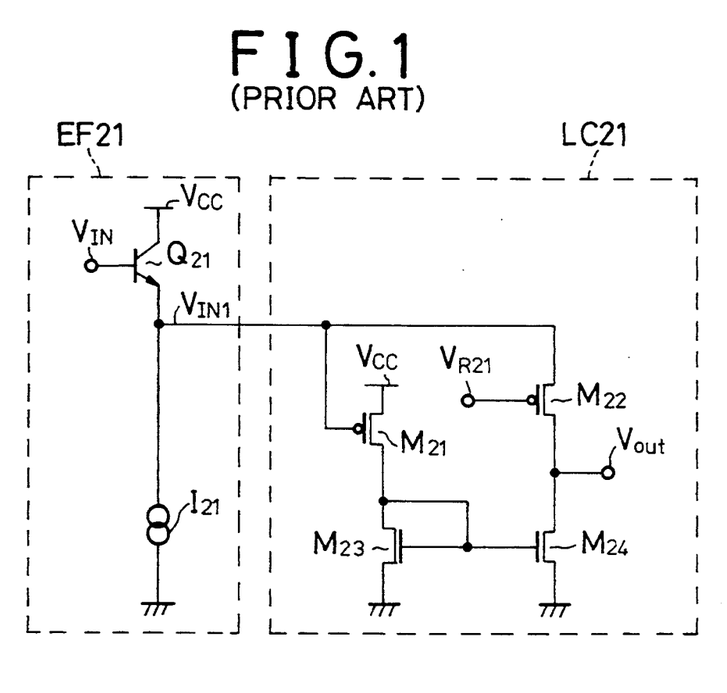
FIG. 1 is a circuit diagram showing an example of a conventional level-shifting circuit.

FIG. 1 is a circuit diagram showing an example of a conventional level-shifting circuit for shifting the level of a signal from the ECL level to the CMOS level. Referring to FIG. 1, input ECL signal $V_{IN}$ is inputted to the base of bipolar transistor $Q_{21}$, and the emitter terminal of transistor $Q_{21}$ is grounded to the lowest potential (hereinafter referred to as ground potential) GND by way of current source $I_{21}$, thereby constituting emitter follower circuit EF21. Output signal $V_{IN1}$ of emitter follower circuit EF21 is inputted to level-shifting circuit LC21. Signal $V_{IN1}$ is inputted to the gate of a P-type MOS field effect transistor (hereinafter referred to as a PMOS FET) $M_{21}$, the source of which is connected to the highest potential (hereinafter referred to as the power supply voltage) $V_{CC}$. The drain of PMOS FET $M_{21}$ is connected to the drain and the gate of an N-type MOS field effect transistor (hereinafter referred to as a NMOS FET) $M_{23}$. The source of NMOS FET $M_{23}$ is connected to ground potential GND, and the gate of NMOS FET $M_{23}$ is connected commonly to the gate of NMOS FET $M_{24}$, whereby an NMOS current mirror circuit is constituted from NMOS FETs $M_{23}$ and $M_{24}$. Input signal $V_{IN1}$ is inputted also to the source of PMOS FET $M_{22}$, the drain of which is connected to the drain of NMOS FET $M_{24}$, whereby a CMOS inverter is constituted from MOS FETs $M_{22}$ and $M_{24}$. The drain terminals of PMOS FET $M_{22}$ and NMOS FET $M_{24}$ make an output terminal of level-shifting circuit LC21. Constant voltage $V_{R21}$ for establishing a reference is applied to the gate of PMOS FET $M_{22}$.

In operation, signal $V_{IN1}$ is level shifted by emitter follower circuit EF21 to a suitable input level voltage which normally presents a high level $V_{CC}-V_f$ or a low level $V_{CC}-V_f-\Delta V$, where $V_f$ is a forward voltage of the pn junction and is about 0.8 V, and $\Delta V$ is a signal amplitude and is about 0.5 to 1.5 V. When the level of signal $V_{IN1}$ is changed to the low level, PMOS FET $M_{21}$ and NMOS FET $M_{24}$ are turned ON via the NMOS current mirror circuit, but PMOS FET $M_{22}$ is turned OFF when $V_{R21}$ is equal to $V_{CC}-V_f-\Delta V-V_{TP}$, where $V_{TP}$ is the threshold voltage level of the PMOS FETs. The threshold voltage level of NMOS FETs is represented by $V_{TN}$. Consequently, output signal out of the drains of PMOS FET $M_{22}$ and NMOS FET $M_{24}$ drops to the ground potential GND. On the other hand, when the level of signal $V_{IN1}$ is changed to the high level if voltage $V_f$ is $V_f=V_{TP}$, PMOS FET $M_{21}$ and NMOS FETs $M_{23}$ and $M_{24}$ are turned OFF, and PMOS FET $M_{22}$ is turned ON. Consequently, output signal $V_{out}$ rises to $V_{out}=V_{IN1}=V_{CC}-V_f$ (refer to ISSCC Digest Of Technical Papers, 1989, p32).

Figure 2:
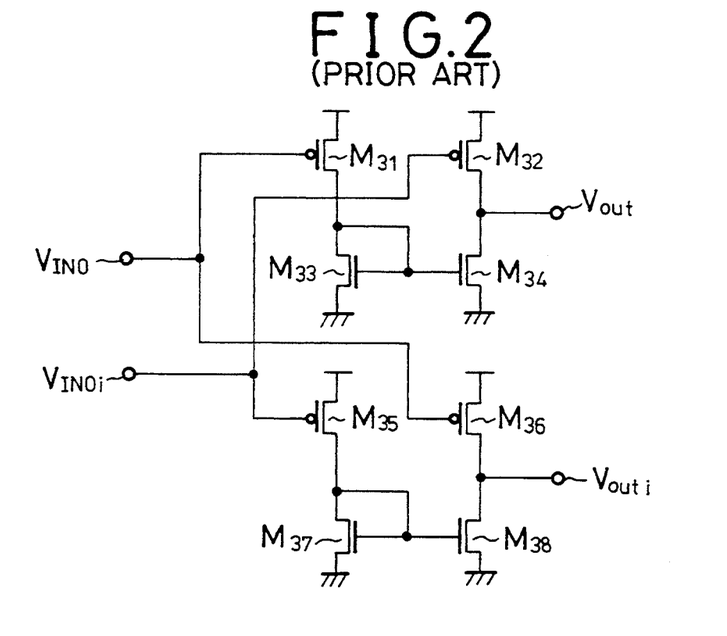
FIG. 2 is a circuit diagram showing an example of a conventional sensing amplifier circuit.

FIG. 2 is a circuit diagram of an example of a conventional sensing amplifier circuit for amplifying a read-out small amplitude signal of a memory circuit. Referring to FIG. 2, input signal $V_{INO}$ which is an operating input signal and another signal $V_{INOi}$ which is opposite in phase to signal $V_{INO}$ are signals having an amplitude of approximately 0.5 to 2 V. Signal $V_{INO}$ is received by the gate of PMOS FET $M_{31}$, and opposite phase signal $V_{INOi}$ is received by the gate of PMOS FET $M_{32}$. A pair of NMOS FETs, $M_{33}$ and $M_{34}$, which form a current mirror circuit are connected to the drains of PMOS FETs $M_{31}$ and $M_{32}$, respectively. Here, the NMOS FET $M_{33}$ side serves for current monitoring while the NMOS FET $M_{34}$ side serves for driving, and the CMOS outputs of PMOS FET $M_{32}$ and NMOS FET $M_{34}$ produce output signal $V_{out}$. A similar circuit wherein the inputs of signals $V_{INO}$ and $V_{INOi}$ to the PMOS gates are reversed is formed from PMOS and NMOS FETs $M_{35}$ to $M_{38}$ and the output of the circuit is signal $V_{outi}$, which is opposite in phase to signal $V_{out}$. A PMOS FET to which an input signal of the low level is inputted is turned up, but a PMOS FET to which an input signal of the high level is inputted is either turned ON at a low level or is turned OFF. Since the level to which PMOS FETs $M_{31}$ and $M_{35}$ are turned ON is transmitted in proportion to the level to which NMOS FETs $M_{34}$ and $M_{38}$ are turned ON due to an effect of the NMOS current mirror circuit, when the level of signal $V_{INO}$ is high and the level of opposite phase signal $V_{INOi}$ is low, output signal $V_{out}$ is raised to $V_{out}=V_{CC}$ by PMOS FET $M_{32}$ while opposite phase signal $V_{outi}$ is lowered to $V_{outi}=$GND by NMOS FET $M_{38}$. This similarly applies in cases in which the inputs are reversed.

Various modifications have also been reported including a sensing amplifier circuit of the same type wherein the transistor which receives an input signal at the gate thereof is formed from an NMOS FET or the current mirror circuit is formed from PMOS FETs (refer to the ISSCC 1990 Digest Of Technical Papers 1990, P134).

In the conventional amplifier circuits described above, since a current mirror circuit is employed, when high-speed operation is required, the responding speed of the current mirror circuit must be high. To this end, the capacities to which the transistors are turned ON on the raising side and the lowering side for receiving input signals must be raised. While the turning on capacity can be raised by adjusting the voltage of the input signal to increase the gate voltage, the turning off capacity is also increased simultaneously, and this results in the increase of through currents and the reduction of the turning ON/OFF ratio. This causes saturation in the increase of the speed and the reduction of the voltage margin arising from an increase of power consumption and a decrease of the amplifying capacity (gain). This is becoming a serious problem in designing high-speed integrated circuits.

Further, in the conventional circuits described above, if the types and/or the switching operation types of the transistors on the raising side and the lowering side for receiving input signals are different, individually optimum input voltages are involved. However, in actual use, signals are inputted at the same voltage to the transistors, and as a result, the conventional circuits fail to exhibit sufficient device performance.

The problems described above are expected to become more serious with the development of larger scale, high-speed integrated circuits.

SUMMARY OF THE INVENTION

It is an object of the present invention to provide a semiconductor circuit which is free from deterioration of the turning ON/OFF capacity ratio arising from an increase of through currents.

It is another object of the present invention to provide a semiconductor circuit which has a high amplifying capacity and is capable of operating at a high speed with low power consumption.

In order to attain these objects, according to one aspect of the present invention, there is provided a semiconductor circuit which receives an input signal of small amplitude and amplifies the input signal into an output signal of great amplitude which is approximately as high as the power supply voltage, comprising a first field effect transistor for receiving a first input signal at the source thereof, a second field effect transistor for receiving at the gate thereof a second input signal which is level shifted from the first input signal, and an output circuit for outputting an output signal in accordance with the difference between the specific conductances of the first and second field effect transistors which vary in accordance with the input signals. The semiconductor circuit may further comprise a current mirror circuit consisting of a pair of field effect transistors having the opposite conductivities to the second field effect transistor, one of the field effect transistors of the current mirror circuit for monitoring current being connected to the drain of the second field effect transistor, the other field effect transistor of the current mirror circuit and the first field effect transistor cooperatively forming a complementary inverter circuit. Alternatively, the semiconductor circuit may further comprise a current mirror circuit consisting of a pair of field effect transistors having the opposite conductivity to the second field effect transistor, one of the field effect transistors of the current mirror circuit for monitoring current being connected to the drain of the first field effect transistor, the other field effect transistor of the current mirror circuit and the second field effect transistor cooperatively forming a complementary inverter circuit.

According to another aspect of the present invention, there is provided a semiconductor circuit which receives an input signal of small amplitude and amplifies the input signal into an output signal of great amplitude which is approximately as high as the power supply voltage, comprising a first field effect transistor which receives a first input signal at the source thereof and receives a first constant reference voltage signal at the gate thereof, and a second field effect transistor which has the opposite conductivity to the first field effect transistor and receives at the gate thereof a second input signal having the opposite phase to the first input signal and further receives at the source thereof a second constant reference voltage signal, the drains of the first and second field effect transistors being connected to each other to form a complementary inverter circuit. Preferably, the second input signal is an input signal having the opposite phase to and level shifted from the first input signal. A common voltage may be used as the first and second constant reference voltages to be applied to the gate of the first field effect transistor and the source of the second field effect transistor. The semiconductor circuit may further comprise means for turning one or both of the first and second field effect transistors off substantially completely by varying the constant reference voltage signal, which is necessary upon operation, to the power source voltage when the circuit is not in operation. In this instance, the semiconductor circuit may further comprise an element for receiving a constant reference voltage signal as a controlling signal and providing an output corresponding to the controlling signal, whereby the semiconductor circuit has an additional function as a logic circuit, or may further comprise a plurality of semiconductor circuits having the same construction as the semiconductor circuit, the outputs of all of the semiconductor circuits being connected commonly thereby to form a multiplexer circuit.

According to a further aspect of the present invention, there is provided a semiconductor circuit of the ECL input type, wherein the semiconductor circuit described above is employed as a level-shifting circuit for amplifying a signal from an ECL input level to approximately the power supply voltage for CMOS or TTL.

According to a still further aspect of the present invention, there is provided a semiconductor circuit, wherein the semiconductor circuit described above is employed as a sensing amplifier circuit which amplifies a signal from an internal low voltage which is approximately as high as the ECL level to approximately the power supply voltage for the TTL level output or alternatively employed as an output buffer circuit for driving an output transistor.

With the semiconductor circuits, a first input signal and a second input signal level shifted from the first input signal are inputted to the source of the first field effect transistor and the gate of the second field effect transistor, respectively. Since the field effect transistor of the current mirror circuit for monitoring current, which has the opposite conductivity to the second field effect transistor, is connected to the drain of the second field effect transistor, which receives the second input signal at the gate thereof, and a complementary inverter circuit is formed from the other field effect transistor of the current mirror circuit and the first field effect transistor, the semiconductor circuits of the present invention can receive optimum voltages individually level-shifted from the first and second input signals even when the types or the switching operation systems of the transistors on the pull-up side and the pull-down side which receive the input signals are different from each other.

Alternatively, a first input signal and a second input signal which has the opposite phase to the first input signal are inputted to the source of the first field effect transistor and the gate of the second field effect transistor which has the opposite conductivity to the first field effect transistor, respectively, and the first and second constant voltages are applied to the gate of the first field effect transistor and the source of the second field effect transistor, respectively. The semiconductor circuits according to the present invention can operate at a high speed since the drains of the first and second field effect transistors are connected to each other thereby to form a complementary inverter circuit and the input signals are inputted to the inverter circuit without employing a current mirror circuit.

Again, since the present invention utilizes the constant reference voltage signals for the control of an amplifier circuit, an amplifier circuit having a high amplification degree, a multiplexer circuit and a logic circuit can be realized.

Other and further objects and aspects of the invention will be obvious after explanation of the illustrative embodiments that will now be described or that will be indicated in the appended claims, and various advantages not referred to herein will be obvious to those skilled in the art upon employment of the invention in practice.

DETAILED DESCRIPTION OF THE PREFERRED EMBODIMENTS

Figures 3, 4:
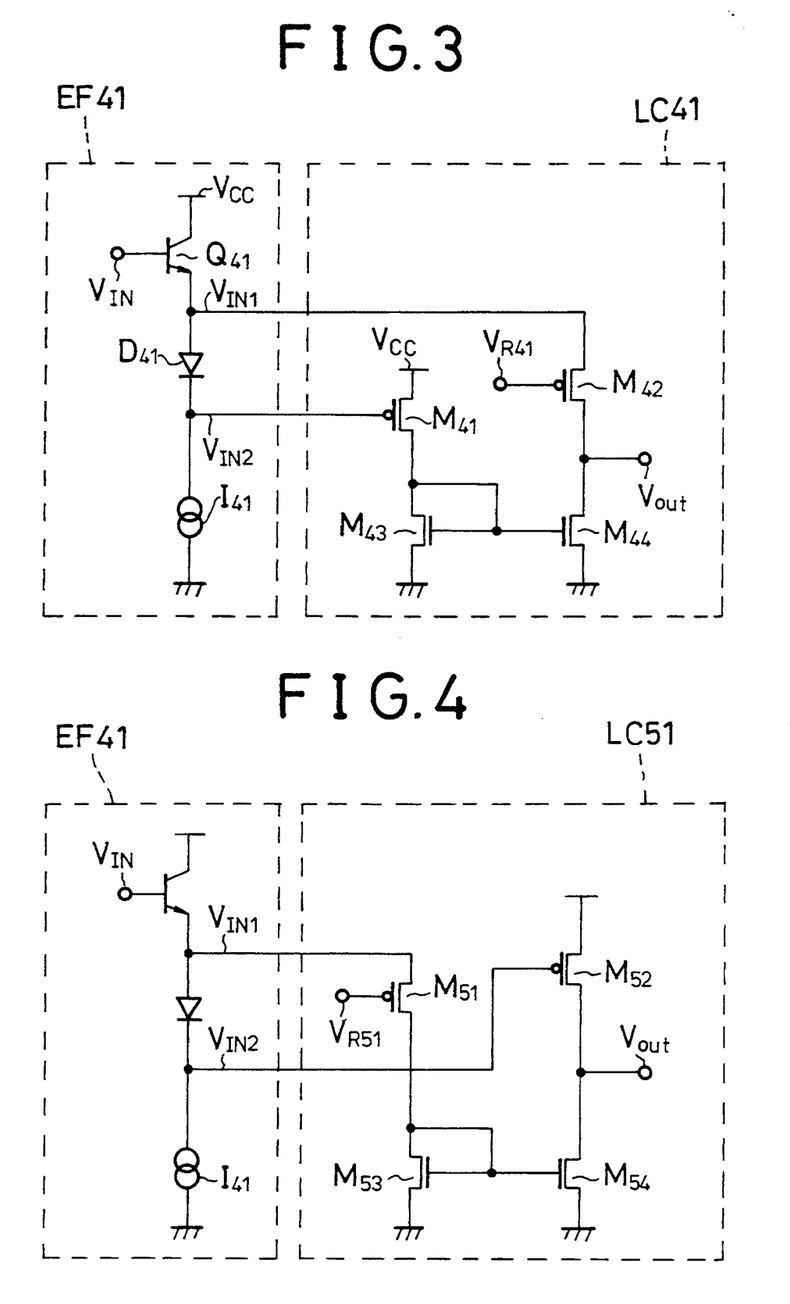
FIG. 3 is a circuit diagram showing a first embodiment of the present invention.
FIG. 4 is a circuit diagram showing a second embodiment of the present invention.

The preferred embodiments of the present invention will now be described with reference to the drawings. FIG. 3 shows in a circuit diagram a semiconductor circuit of a first preferred embodiment of the present invention.

Referring to FIG. 3, input signal $V_{IN}$ is inputted to the base of bipolar transistor $Q_{41}$ in emitter follower circuit EF41. The emitter terminal of bipolar transistor $Q_{41}$ is connected to the anode of pn junction type diode $D_{41}$, and the cathode of diode $D_{41}$ is grounded to the ground potential GND by way of current source $I_{41}$. Output signals $V_{IN1}$ and $V_{IN2}$ of emitter follower circuit EF41 are inputted to level-shifting circuit LC41. Here, signal $V_{IN1}$ has a level shifted down by pn junction forward voltage $V_f$ from signal $V_{IN}$, and signal $V_{IN2}$ has another level shifted down by 2 $V_f$ from signal $V_{IN}$. In level-shifting circuit LC41, signal $V_{IN2}$ is inputted to the gate of PMOS FET $M_{41}$. The source of PMOS FET $M_{41}$ is connected to the power supply voltage $V_{CC}$, and the drain of PMOS FET $M_{41}$ is connected to the drain and the gate of NMOS FET $M_{43}$, the source of which is connected to the ground potential GND. The gate of NMOS FET $M_{43}$ is also connected to the gate of NMOS FET $M_{44}$, and an NMOS current mirror circuit is constituted from NMOS FETs $M_{43}$ and $M_{44}$. Input signal $V_{IN1}$ is inputted to the source of PMOS FET $M_{42}$ and the drain of PMOS FET $M_{42}$ is connected to the drain of NMOS FET $M_{44}$, thereby constituting a CMOS inverter. The common drains of PMOS FET $M_{42}$ and NMOS FET $M_{44}$ provide output signal $V_{out}$ of level-shifting circuit LC41. Constant voltage $V_{R41}$ for reference is applied to the gate of PMOS FET $M_{42}$.

In operation, when it has, for example, an ECL amplitude of small amplitude, input signal $V_{IN}$ to emitter follower circuit EF41 presents a high level equal to the power supply voltage $V_{CC}$ or a low level equal to $V_{CC} - \Delta V$, where $\Delta V$ is an amplitude of the input signal. The input levels of signals $V_{IN1}$ and $V_{IN2}$ are given by equations (1) to (4) below:

$$VIN1\ (H) = V_{CC} - V_f = 4.2\ V \tag{1}$$

$$VIN1\ (L) = V_{CC} - V_f - \Delta V = 2.7\ V \tag{2}$$

$$VIN2\ (H) = V_{CC} - 2\ V_f = 3.4\ V \tag{3}$$

$$VIN2\ (L) = V_{CC} - 2\ V_f - \Delta V = 1.9\ V \tag{4}$$

where $V_{CC} = 5$ V, $V_f = 0.8$ V, and $\Delta V = 1.5$ V.

Since signal $V_{IN1}$ is inputted to the source of PMOS FET $M_{42}$ for pull-up of signal $V_{out}$, the capacity of PMOS FET $M_{42}$ can be controlled by adjusting the level of voltage $V_{R41}$. In order to maximize the difference between the turning on and off capacities, the level of voltage $V_{R41}$ should be equal to $V_{IN1}(L) - V_{TP}$. The response from the input to the output is comparatively high in speed since only one stage of the MOS gate is involved, and in order to further raise the speed, the level of voltage $V_{R41}$ should be lowered although the through current of PMOS FET $M_{42}$ increases. The factor which determines the speed of level-shifting circuit LC41 is the turning ON/OFF of PMOS FET $M_{41}$. In the conventional circuit shown in FIG. 1, signal $V_{IN1}$ is inputted to the gate of PMOS FET $Q_{21}$, which corresponds to PMOS FET $M_{41}$, and gate voltage $V_G$ for controlling the turning on capacity of PMOS FET $M_{21}$ when the input level is low is $V_G = -V_f - \Delta V = -2.3$ V. On the other hand, in the circuit of the present embodiment wherein signal $V_{IN2}$ is inputted to the gate of PMOS FET $M_{41}$, gate voltage $V_G$ is $V_G = -2\ V_f - \Delta V = -3.1$ V, and consequently, the turning on capacity is twice or more the turning on capacity of the conventional circuit.

If the capacity of PMOS FET $M_{41}$ is raised by adjusting the left shift amount which is provided by diode $D_{41}$ in emitter follower circuit EF41, even though the through current increases when it is in the OFF state, the size of PMOS FET $M_{41}$ can be decreased so that the response of the NMOS current mirror circuit can be increased in speed. Operation from the input to the output will be described subsequently. When signals $V_{IN1}$ and $V_{IN2}$ are both at the low level, PMOS FET $M_{42}$ is OFF while PMOS FET $M_{41}$ is ON and NMOS FET $M_{44}$ is ON, and consequently, signal $V_{out}$ drops. In contrast, when signals $V_{IN1}$ and $V_{IN2}$ are at the high level, PMOS FET M₄₂ is ON while PMOS FET M₄₂ is OFF and NMOS FET M₄₄ is OFF, and consequently, signal $V_{out}$ rises. Accordingly, the rising and dropping responding speeds of output signal $V_{out}$ can be raised to their optimal values within the range permitted by the through current by adjusting the level of voltage $V_{R41}$ and the input level shift amount ($=V_{IN1}-V_{IN2}$), respectively. In this instance, since output level $V_{out}(H)$ is equal to $V_{out}(H)=V_{CC}-V_f$ and output level $V_{out}(L)$ is equal to 0, there is no problem with a CMOS input system circuit at the next stage. If a circuit is designed with a consumed current substantially the same as in conventional circuits (about 0.3 to 0.5 mA) using the present circuit arrangement, the speed can be improved by about 20 to 30%.

FIG. 4 shows in circuit diagram a semiconductor circuit of a second preferred embodiment of the present invention which is a modification to the semiconductor circuit of the first embodiment. Here in the present semiconductor circuit, PMOS FET M₅₁ which receives the input of signal $V_{IN1}$ at the source thereof is connected as a pull-down transistor for output signal $V_{out}$ to emitter follower circuit EF₄₁, and PMOS FET M₅₂ which receives the input of signal $V_{IN2}$ at the gate thereof is connected as a pull-up transistor for output signal $V_{out}$ to emitter follower circuit EF₄₁. Constant voltage $V_{R51}$ for reference is applied to the gate of PMOS FET M₅₁. In the present circuit arrangement, when input signal $V_{IN}$ is at the high level, output signal $V_{out}$ presents the low level, but when input signal $V_{IN}$ is at the low level, output signal $V_{out}$ presents the high level. Thus, the present circuit arrangement realizes the reverse logic to that of the circuit arrangement of the first embodiment.

Figure 5:
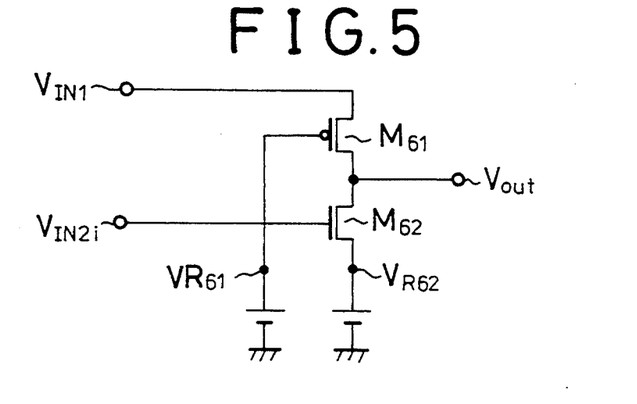
FIG. 5 is a circuit diagram showing a third embodiment of the present invention.

A further developed semiconductor circuit is a third preferred embodiment of the present invention and is shown in the circuit diagram of FIG. 5. As shown in FIG. 5, the semiconductor circuit of the present embodiment does not employ a current mirror circuit but is in the form of a mere amplifier circuit wherein PMOS FET M₆₁ and NMOS FET M₆₂ are connected to a CMOS inverter. Input signal $V_{IN1}$ is inputted to the source of PMOS FET M₆₁, and constant voltage $V_{R61}$ is applied to the gate of PMOS FET M₆₁. Another input signal $V_{IN2i}$ which is level shifted from input signal $V_{IN1}$ and is opposite in phase is inputted to the gate of NMOS FET M₆₂, and another constant voltage $V_{R62}$ is applied to the source of NMOS FET M₆₂.

In operation, when signal $V_{IN1}$ is at the high level and opposite phase signal $V_{IN2i}$ is at the low level, PMOS FET M₆₁ is ON and NMOS FET M₆₂ is OFF, and consequently, output signal $V_{out}$ rises to $V_{out}=V_{IN1}$. When signal $V_{IN1}$ is at the low level and opposite phase signal $V_{IN2i}$ is at the high level, PMOS FET M₆₁ is OFF and NMOS FET M₆₂ is ON, and consequently, output signal $V_{out}$ drops to $V_{out}=V_{R62}$. Here, when signals $V_{IN1}$ and $V_{IN2}$ have the values given by equations (1) to (4) above, the high and low levels of the gate voltage $V_G$ which rises and drops with the high and low levels of signal $V_{IN1}$ to PMOS FET M₆₁ are given by following equations (5) and (6), respectively:

$$V_G(M_{61}:H) = V_{CC} - V_f - V_{R61} \qquad (5)$$

$$V_G(M_{61}:L) = V_{CC} - V_f - \Delta V - V_{R61} \qquad (6)$$

Similarly, the high and low levels of the gate voltage $V_G$ which rises and drops with the high and low levels of signal $V_{IN2}$ to NMOS FET M₆₂ are given by following equations (7) and (8), respectively:

$$V_G(M_{62}:H) = V_{CC} - 2V_f - V_{R62} \qquad (7)$$

$$V_G(M_{62}:L) = V_{CC} - 2V_f - \Delta V_{R62} \qquad (8)$$

According to the present embodiment, by designing the turning ON/OFF capacity ratio of each transistor to its maximum value, a maximum amplifier gain can be obtained in a condition wherein the flow of the through current is nearly eliminated. To this end, the gate voltages $V_G$ when the transistors are OFF should be set to threshold value $V_{TP}$ of the PMOS transistor and $V_{TN}$ of the NMOS transistor, and accordingly, $$V_G(M_{62}:H) = V_{CC} - V_f - \Delta V - V_{R61} = -V_{TP} \qquad (9)$$

$$V_G(M_{62}:L) = V_{CC} - 2V_f - \Delta V - V_{R62} = -V_{TN} \qquad (10)$$

Thus, if constant voltages $V_{R61}$ and $V_{R62}$ for reference are calculated from the equations (9) and (10) above, they are given by equations (11) and (12) below, respectively:

$$V_{R61} = V_{CC} - V_f - \Delta V + V_{TP} = 5 - 0.8 - 1.5 - 1.6 = 1.1 \qquad (11)$$

$$V_{R62} = V_{CC} - 2V_f - \Delta V + V_{TP}5 - 1.6 - 1.5 - 1.6 = 0.9 \qquad (12)$$

A back bias effect arising from the difference between the substrate potential and the source potential is taken into consideration in equation (11) and (12) given above, while the threshold valves of the MOS transistors are considered to be $V_{TP}=0.8$ V and $V_{TN}=0.8$ V if the source voltage is equal to the substrate potential.

By setting voltages $V_{R61}$ and $V_{R62}$ in this manner, output signal $V_{out}$ presents the levels of $H=V_{IN1}(H)=V_{CC}-0.8$ V and $L=V_{R62}=0.9$ V, which are considered to be sufficient levels for inputting to a CMOS FET at the next stage. The responding time of the semiconductor circuit of the present embodiment is decreased to about one half that of conventional semiconductor circuits which employ an NMOS current mirror circuit, and the through current is decreased to about 10 to 30%.

Figure 6:
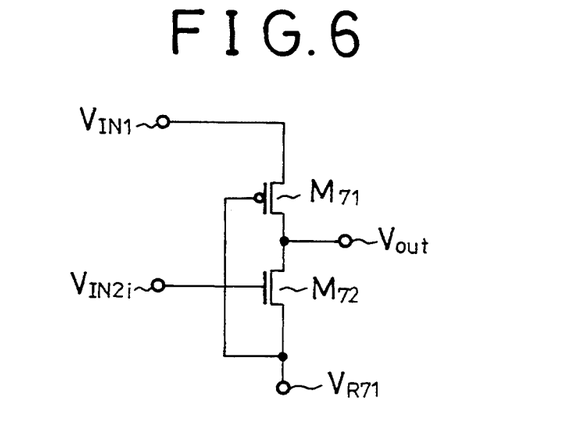
FIG. 6 is a circuit diagram showing a fourth embodiment of the present invention.

In the circuit diagram of FIG. 6 is shown a semiconductor circuit of a fourth preferred embodiment of the present invention which is a simplified form of the semiconductor circuit of the third embodiment shown in FIG. 5. In the present semiconductor circuit, only one constant voltage for reference is involved which is applied as voltage $V_{R71}$ both to the gate of PMOS FET M₇₁ and the source of NMOS FET M₇₂. As indicated by equations (11) and (12) above, reference levels for PMOS FET M₇₁ and NMOS FET M₇₂ can be made substantially equal to each other by suitably adjusting the two input signals $V_{IN1}$ and $V_{IN2i}$. In short, constant voltage $V_{R71}$ for reference should be equal to $V_{R71}=1$ V, by which a necessary signal system can be simplified.

Figure 7:
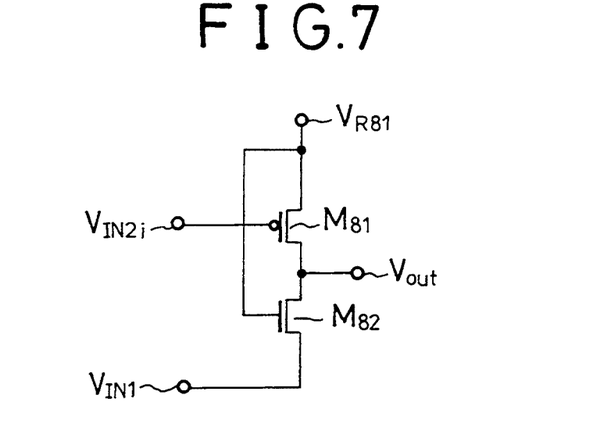
FIG. 7 is a circuit diagram showing a fifth embodiment of the present invention.

Similarly, FIG. 7 shows in circuit diagram a semiconductor circuit of a fifth preferred embodiment of the present invention wherein input signals $V_{IN1}$ and $V_{IN2i}$ are inputted at voltages determined from the ground potential GND, similar to the semiconductor circuit of the fourth embodiment described above. The present semiconductor circuit is different from the semiconductor circuit shown in FIG. 6 only in that voltage $V_{R81}$ is applied and PMOS FET M₈₁ and NMOS FET M₈₂ are handled reversely to the PMOS FET M₇₁ and NMOS FET M₇₂ in the semiconductor circuit shown FIG. 6. The present semiconductor circuit indicates that the concept of the present invention can be applied to a semiconductor circuit which receives an input signal other than an ECL input such as when the potentials of input signals $V_{IN1}$ and $V_{IN2i}$ are low.

Figure 8:
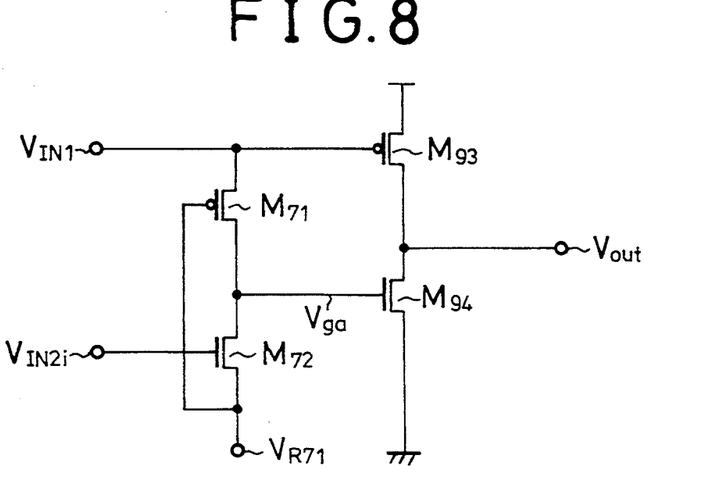
FIG. 8 is a circuit diagram showing a sixth embodiment of the present invention.

FIG. 8 shows in circuit diagram a semiconductor circuit of a sixth preferred embodiment of the present invention. Referring to FIG. 8, the semiconductor circuit shown is an amplifier circuit for outputting output signal $V_{out}$ with a full amplitude from the power supply voltage $V_{CC}$ to the ground potential GND. Input signals $V_{IN1}$ and $V_{IN2i}$, PMOS FET $M_{71}$, NMOS FET $M_{72}$ and constant voltage $V_{R71}$ for reference are each similar to those of the semiconductor circuit of the fourth embodiment shown in FIG. 6. Output signal $V_{out}$ of the CMOS inverter circuit in the fourth embodiment is inputted as signal $V_{ga}$ to the gate of NMOS FET $M_{94}$, and input signal $V_{IN1}$ is inputted to the gate of PMOS FET $M_{93}$. A CMOS inverter is thus constituted from PMOS FET $M_{93}$ and NMOS FET $M_{94}$, and output signal $V_{out}$ of the CMOS inverter is outputted as an output of the amplifier circuit.

In operation, when input signal $V_{IN1}$ is at the high level and input signal $V_{IN2i}$ is at the low level, signal $V_{ga}$ presents the high level from the description given above, and consequently, PMOS FET $M_{93}$ is OFF while NMOS FET $M_{94}$ is ON and output signal $V_{out}$ drops until the ground potential GND is reached. When input signal $V_{IN1}$ is at the low level and input signal $V_{IN2i}$ is at the high level, signal $V_{ga}$ presents the low level. Consequently, PMOS FET $M_{93}$ is ON and NMOS FET $M_{94}$ is OFF, and output signal $V_{out}$ rises until it reaches to the power supply potential $V_{CC}$. When PMOS FET $M_{93}$ is OFF, the gate voltage is $V_G = -0.8$ V, and when PMOS FET $M_{94}$ is OFF, the gate voltage is $V_G = 1.0$ V, and consequently, little through current flows through the CMOS circuit at the portion.

Figure 14A:
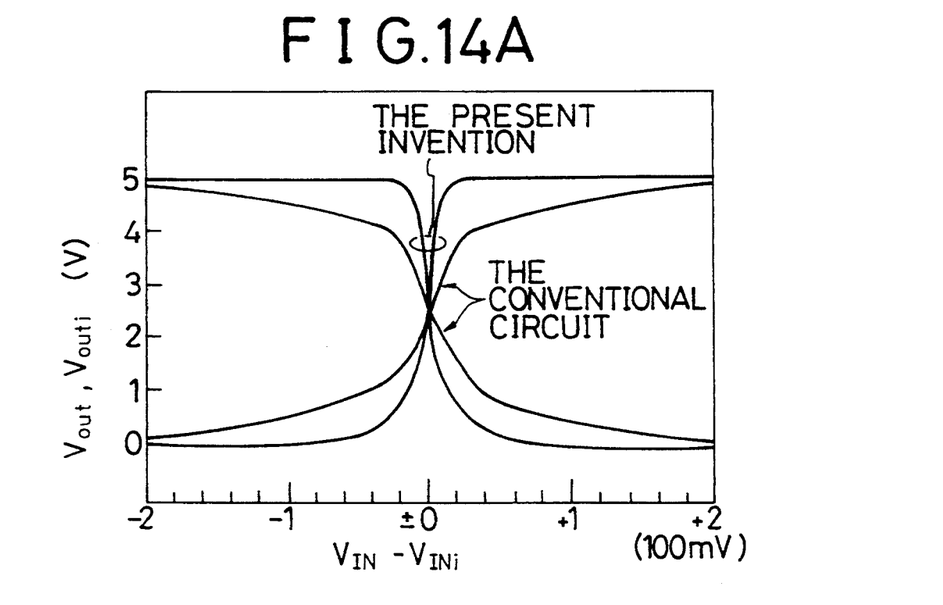
FIG. 14A is a diagram of the DC characteristics showing variations of output signal voltages with respect to input signal difference voltages in a semiconductor circuit of the present invention and a conventional semiconductor circuit.
Figure 14B:
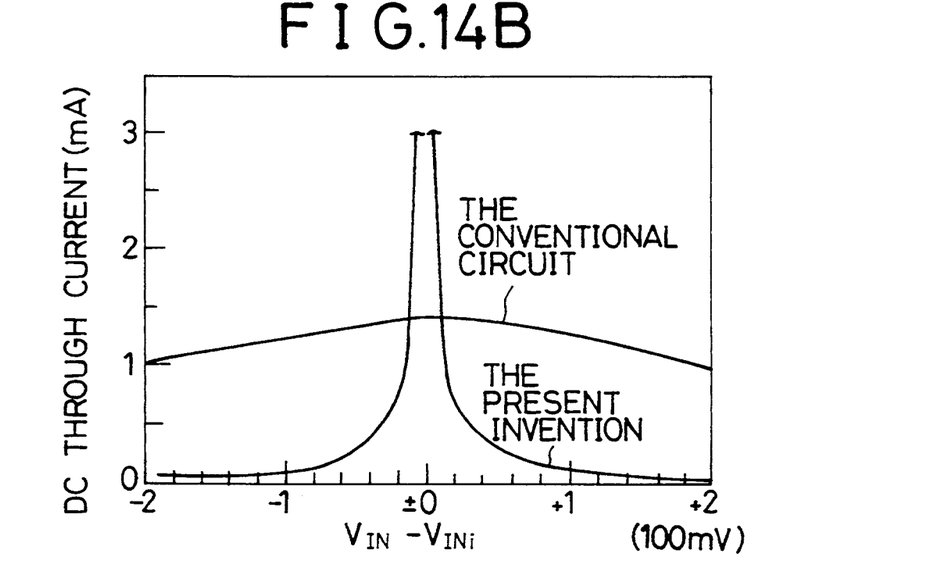
FIG. 14B is a diagram of DC characteristics showing variations of DC through current consumption with respect to input signal difference voltages in a semiconductor circuit of the present invention and a conventional semiconductor circuit.
Figure 15:
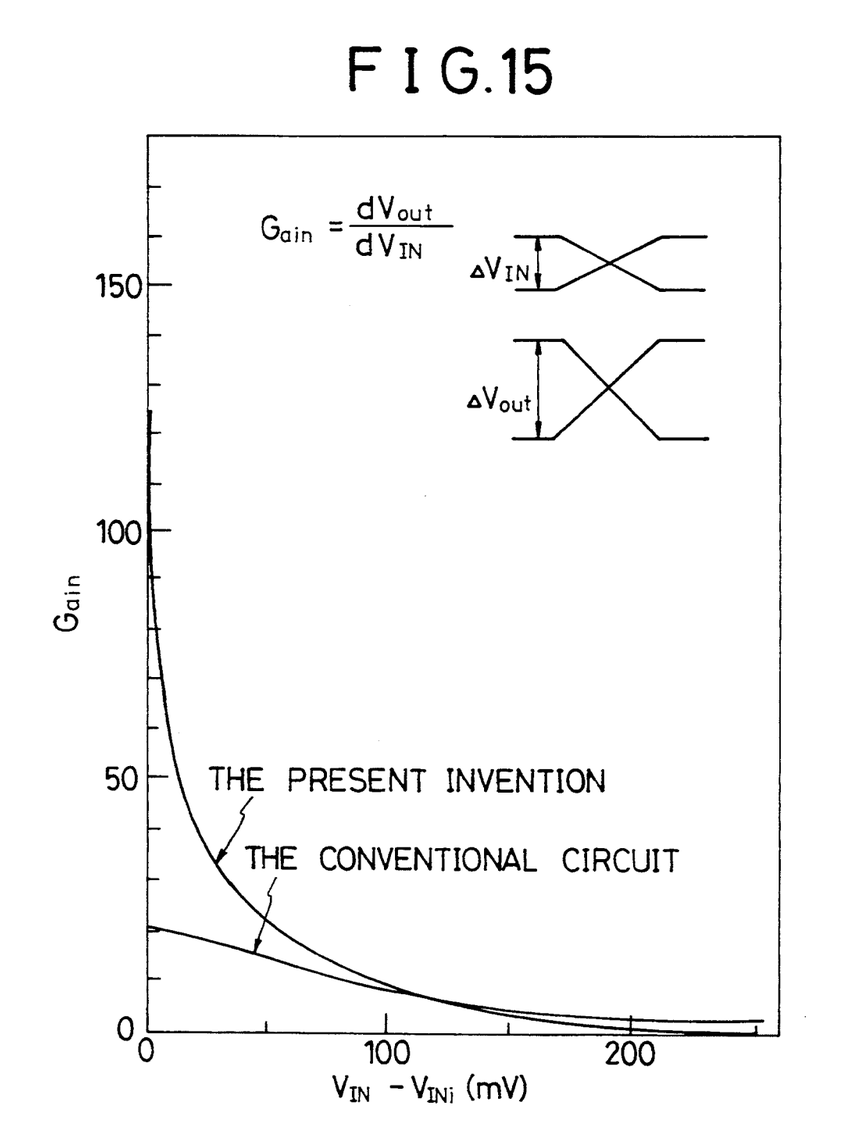
FIG. 15 is a diagram of DC characteristics showing amplifier gain with respect to input amplitude in a semiconductor circuit of the present invention.

The input DC characteristics of a semiconductor circuit of the present invention will now be described in comparison with those of a conventional semiconductor circuit. Here, the current mirror type circuit shown in FIG. 2 is employed as the conventional semiconductor circuit while the semiconductor circuit of the present invention is a circuit in which the circuit shown in FIG. 8 is included by two circuits, one of which receives input signals $V_{IN1}$ and $V_{IN2i}$ and provides output signal $V_{out}$ and the other of which receives input signals $V_{IN1i}$ and $V_{IN2}$ having the opposite phase to those of input signals $V_{IN1}$ and $V_{IN2i}$, respectively, and provides output signal $V_{outi}$. Each of the semiconductor circuits is constructed as a sensing amplifier of the differential input type. The semiconductor circuits are designed for high-speed operation, and in the conventional semiconductor circuit, the input voltages are adjusted to level-shifted values and set to signal $V_{IN0} = V_{IN2}$ and signal $V_{IN0i} = V_{IN2i}$ so that the responding speed of approximately 0.5 to 1.0 ns may be achieved. Results are shown in FIGS. 14A and 14B. Values of output signal potentials $V_{out}$ and $V_{outi}$ with respect to potential difference $V_{IN} - V_{INi}$ of the input signals are shown in FIG. 14A, and values of currents flowing through the circuits with respect to potential difference $V_{IN} - V_{INi}$ of the input signals are shown in FIG. 14B. As seen from FIGS. 14A and 14B, with the conventional semiconductor circuit, an input potential difference greater than about 400 mV is required for reversal of the output level, but with the semiconductor circuit of the present invention, only about 100 to 200 mV is required, and a large through current (about 3 to 5 mA) flows only in a small region. In the conventional semiconductor circuit, since the gate voltage to the PMOS FET is raised, when the PMOS FET is ON, to raise the turning on capacity in order to achieve high speed, when the PMOS FET is to be turned OFF, it is not turned OFF completely and a large through current continues to flow through the PMOS FET. This arises from the fact that, since an NMOS current mirror circuit is involved in the conventional semiconductor circuit, current flows also through the monitoring NMOS of the current mirror circuit on the side on which the output presents the low level, and it can be seen that the conventional semiconductor circuit always dissipates a current of 1 to 1.5 mA. In FIG. 15, values of gains of the semiconductor circuit of the present invention and the conventional semiconductor circuit as amplifiers are seen with respect to input potential difference $\Delta V_{IN} = V_{IN} - V_{INi}$. It can be seen from FIG. 15 that compared with a conventional semiconductor circuit, the semiconductor circuit of the present invention has a high gain which is 5 times at the maximum and 2 times at the average within the range of potential difference $\Delta V_{IN} = 100$ mV.

Figure 9:
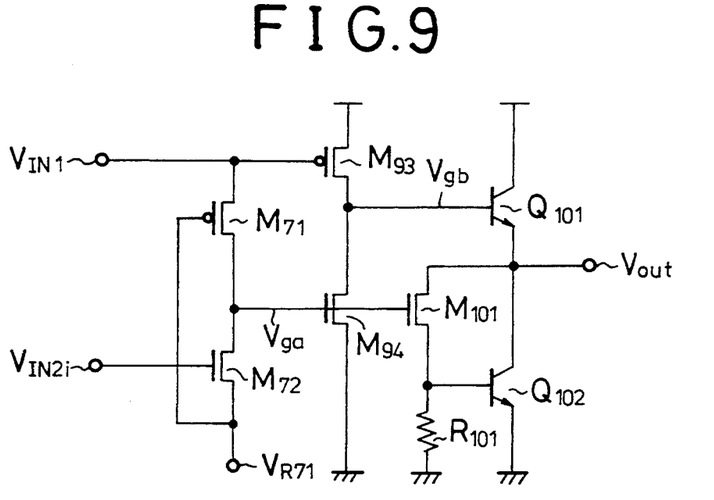
FIG. 9 is a circuit diagram showing a seventh embodiment of the present invention.

Referring now to FIG. 9, there is shown in circuit diagram a semiconductor circuit of a seventh preferred embodiment of the present invention. The semiconductor circuit shown is designed so that it can drive a high-output load. The output signal of the sixth embodiment shown in FIG. 8 is inputted as signal Vgb to the base of bipolar transistor $Q_{101}$. The emitter of bipolar transistor $Q_{101}$ is employed as the output terminal of output signal $V_{out}$ so that it is utilized to pull up output signal $V_{out}$. Gate signal $V_{ga}$ on the pull-down side is inputted not only to NMOS FET $M_{94}$ but also to the gate of NMOS FET $M_{101}$, the drain and the source of which are connected to the collector and the base of bipolar transistor $Q_{102}$, respectively. The collector of bipolar transistor $Q_{102}$ is connected to the terminal of output signal $V_{out}$ so that it is utilized to pull down output signal $V_{out}$. Resistor $R_{101}$ is interposed between the base of transistor $Q_{102}$ and the ground potential GND to avoid the base of transistor $Q_{102}$ being put into a floating state when NMOS FET $M_{101}$ is OFF. In short, the semiconductor circuit of the present embodiment is a modification to the semiconductor circuit which employs a CMOS inverter for driving output signal $V_{out}$ shown in FIG. 8 in that it additionally includes a BiCMOS inverter for driving output signal $V_{out}$. Accordingly, the responding speed of the present semiconductor circuit is 0.5 to 1.0 ns, which is substantially equal to that of a circuit of the CMOS driving type, and the present semiconductor circuit can drive a load of 0.5 to several tens pF.

Figure 10:
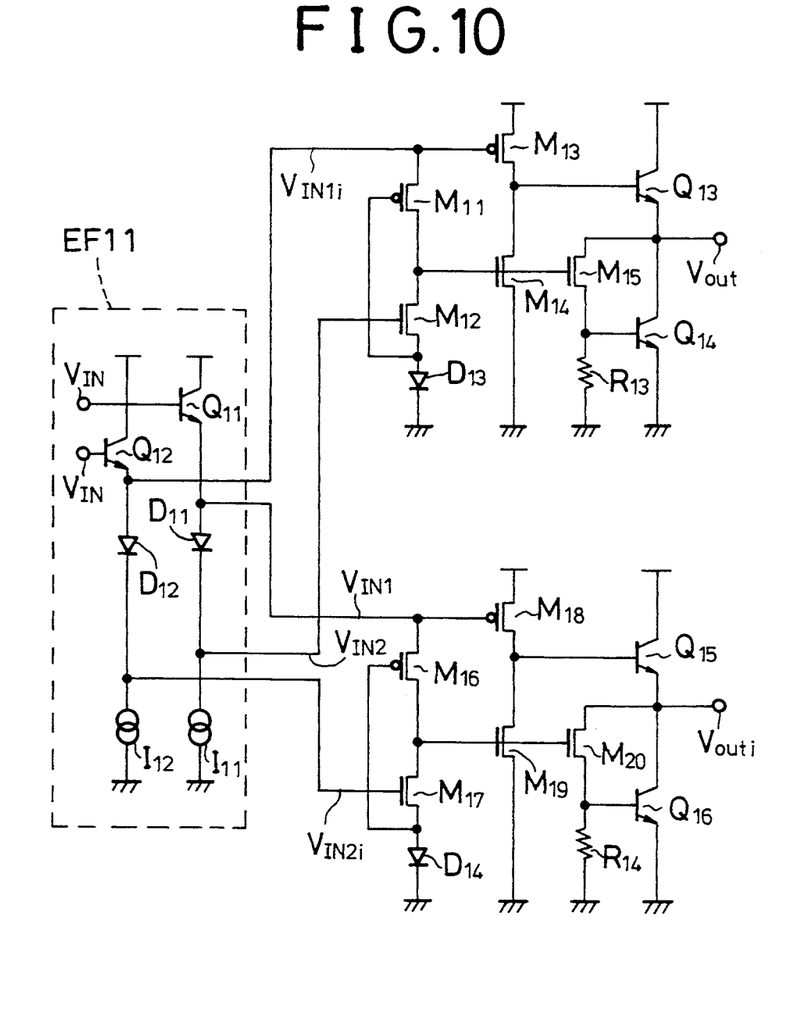
FIG. 10 is a circuit diagram showing an eighth embodiment of the present invention.
Figure 16:
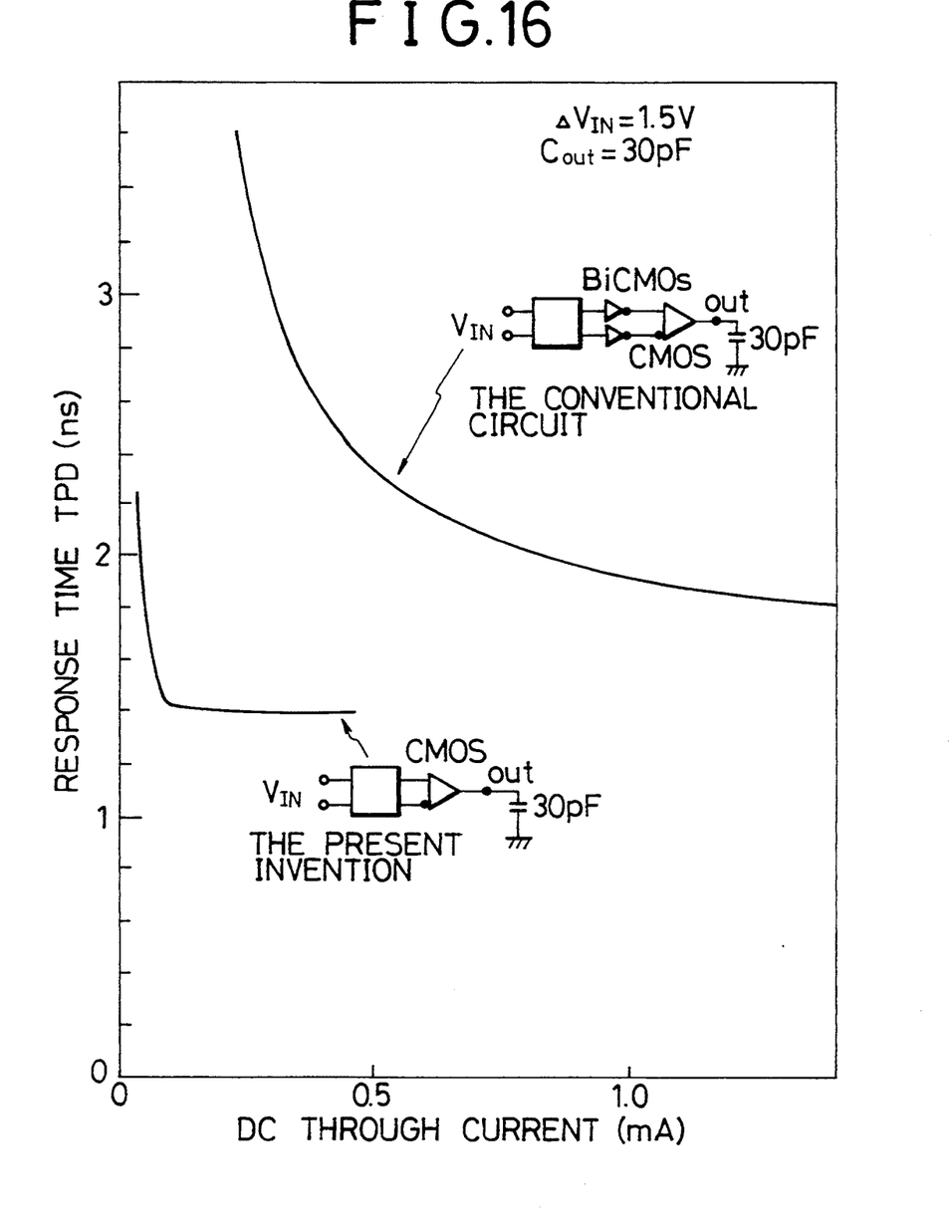
FIG. 16 is a characteristic diagram showing speed with respect to current consumption of an amplifier circuit until a TTL output is obtained when an output transistor of a semiconductor circuit of the present invention is driven.

Referring now to FIG. 10, there is shown a semiconductor circuit of an eighth preferred embodiment of the present invention. The semiconductor circuit shown is a sensing amplifier wherein a plurality of BiCMOS type amplifiers are combined into a differential input scheme. Emitter follower circuit EF11 generates input signal VIN1, another input signal $V_{IN1i}$ having the opposite phase to that of signal $V_{IN1}$ and signals $V_{IN2}$ and $V_{IN2i}$ level shifted from signals $V_{IN1}$ and $V_{IN1i}$, respectively. The voltage information is similar to that of emitter follower circuit EF41 shown in each of FIGS. 3 and 4. A pair of amplifier circuits are involved including an amplifier circuit which receives input signals $V_{IN1i}$ and $V_{IN2}$ and outputs output signal $V_{out}$ and another amplifier circuit which receives signals $V_{IN1}$ and $V_{IN2i}$ and outputs output signal $V_{outi}$. Each of the amplifier circuits has a simplified circuit configuration wherein a necessary constant voltage portion for reference is connected to the ground potential GND by way of diode $D_{13}$ or $D_{14}$. Since the constant voltage may be about 1.0 V as described above, it may be substituted by $V_f=0.8$ V by means of a diode. Further, this value is represented in the form of $V_{CC}-\alpha$ from equations (11) and (12) above. In short, while the present value is a value determined from the power supply potential $V_{CC}$, even if it is set from the ground potential GND, the variation of the gate voltage value by a variation of the potential $V_{CC}$ has little influence upon operation because the variation appears with substantially the same values on both the PMOS FET side and the NMOS FET side. FIG. 16 presents comparative data for cases in which output transistors (an NMOS current mirror circuit) are connected to the output terminals from which signals $V_{out}$ and $V_{outi}$ are outputted and an output load of 30 pF is driven and when a BiCMOS inverter circuit is inserted as a buffer in the conventional circuit shown in FIG. 2 and a similar output load is driven by way of similar output transistors.

Referring to FIG. 16, the data is compared in terms of the response time $t_{pd}$ from the input to DC through current at the sensing amplifier portion to output transistor Out. It can be seen that response time $t_{pd}$ is shorter by about 0.5 to 1 ns with the circuit of the present invention, and that the current is decreased by between approximately two thirds to nine tenths.

Comparison of the performance in terms of the product of current and response time proves that the circuit of the present invention is reduced to about one tenth the conventional circuit and accordingly, is improved significantly over the conventional circuit.

Further, as an application of a semiconductor circuit of the present invention, a logic circuit which operates in accordance with a controlling signal and also serves as an amplifier circuit can be realized without deterioration of the amplification performance.

Figure 11:
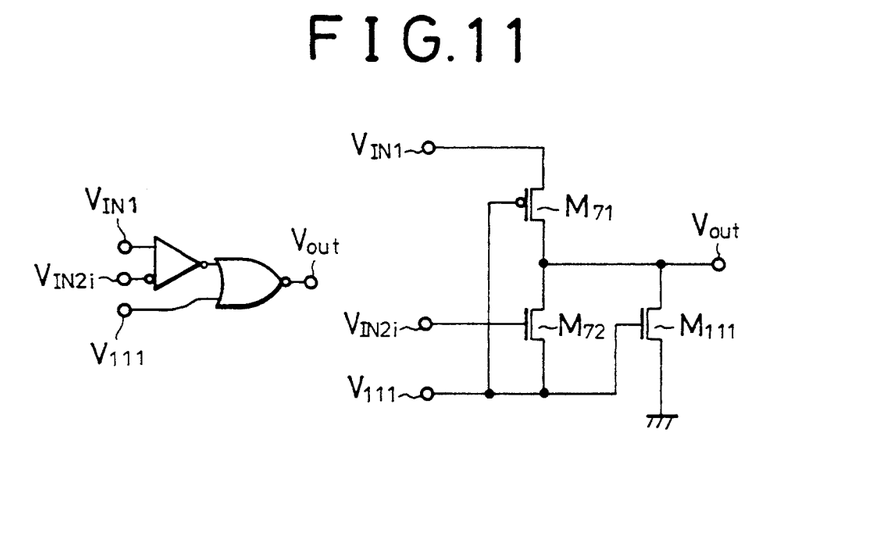
FIG. 11 is a circuit diagram showing a ninth embodiment of the present invention.

FIG. 11 shows a semiconductor circuit of a ninth preferred embodiment of the present invention. The present semiconductor circuit is a modification of the semiconductor circuit shown in FIG. 6 in that it additionally includes NMOS FET $M_{111}$, the drain of which is connected to the output terminal of output signal $V_{out}$ of the amplifier circuit of FIG. 6 so that constant voltage $V_{111}$, which is used in the amplifier circuit portion, is also inputted to the gate of NMOS FET $M_{111}$. When voltage $V_{111}$ is equal to a preset constant voltage value (up to 1 V), NMOS FET $M_{11}$ is OFF, and consequently, the circuit of the present embodiment functions as an amplifier circuit. On the other hand, when voltage $V_{111}$ is at the high level, both PMOS FET $M_{71}$ and NMOS FET $M_{72}$ are OFF and NMOS FET $M_{11}$ is ON, and consequently, output signal $V_{out}$ presents the low level. In this instance, the circuit of the present embodiment has the form in which also a NOR gate is included. In an ordinary logic circuit, since series connection of PMOS FETs or NMOS FETs is required, the characteristics of the amplifier circuit are influenced and a variation in preset gain and/or responding speed cannot be avoided. In the arrangement of the present embodiment, however, a logic circuit can be incorporated into an amplifier circuit without having a significant influence on characteristics of the amplifier circuit.

Figure 12:
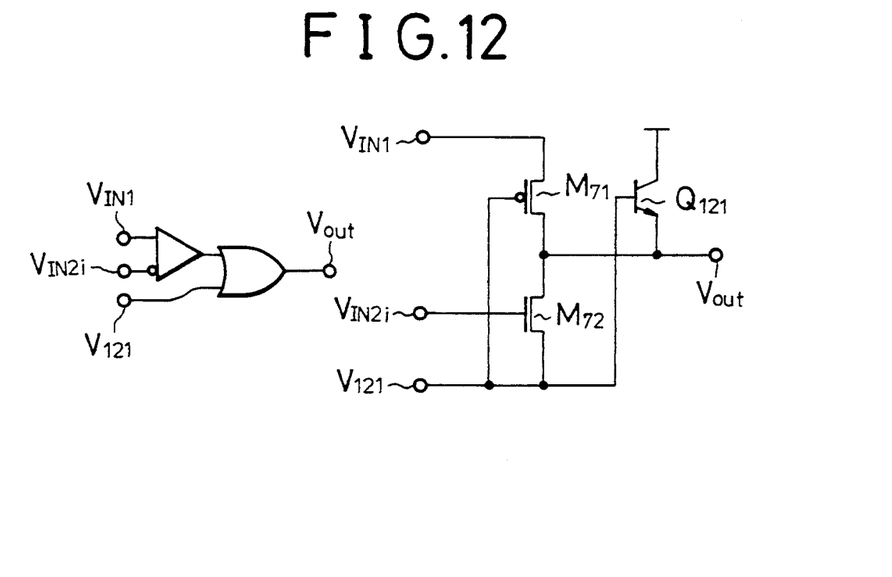
FIG. 12 is a circuit diagram showing a tenth embodiment of the present invention.

A semiconductor circuit of a tenth preferred embodiment of the present invention in which a NOR gate is incorporated similarly is shown in FIG. 12. Referring to FIG. 12, in the semiconductor circuit shown, the base of bipolar transistor $Q_{121}$ is connected to an input terminal of voltage signal $V_{121}$, and the emitter of transistor $Q_{121}$ is connected to another terminal of output signal $V_{out}$. When signal $V_{121}$ is at the low level (about 1.0 V which is the preset potential), transistor $Q_{121}$ is OFF, but when signal $V_{121}$ is at the high level, transistor $Q_{121}$ is turned ON simultaneously when PMOS FET $M_{71}$ and NMOS FET $M_{72}$ are turned OFF, and signal $V_{out}$ is consequently put into the high potential condition. The reason why a logic circuit can be constructed readily as described above is that both the PMOS and NMOS FETs which constitute an amplifier circuit can be put into an OFF state by setting the constant voltage for reference to a high voltage approximately equal to the power supply potential $V_{CC}$.

Figure 13:
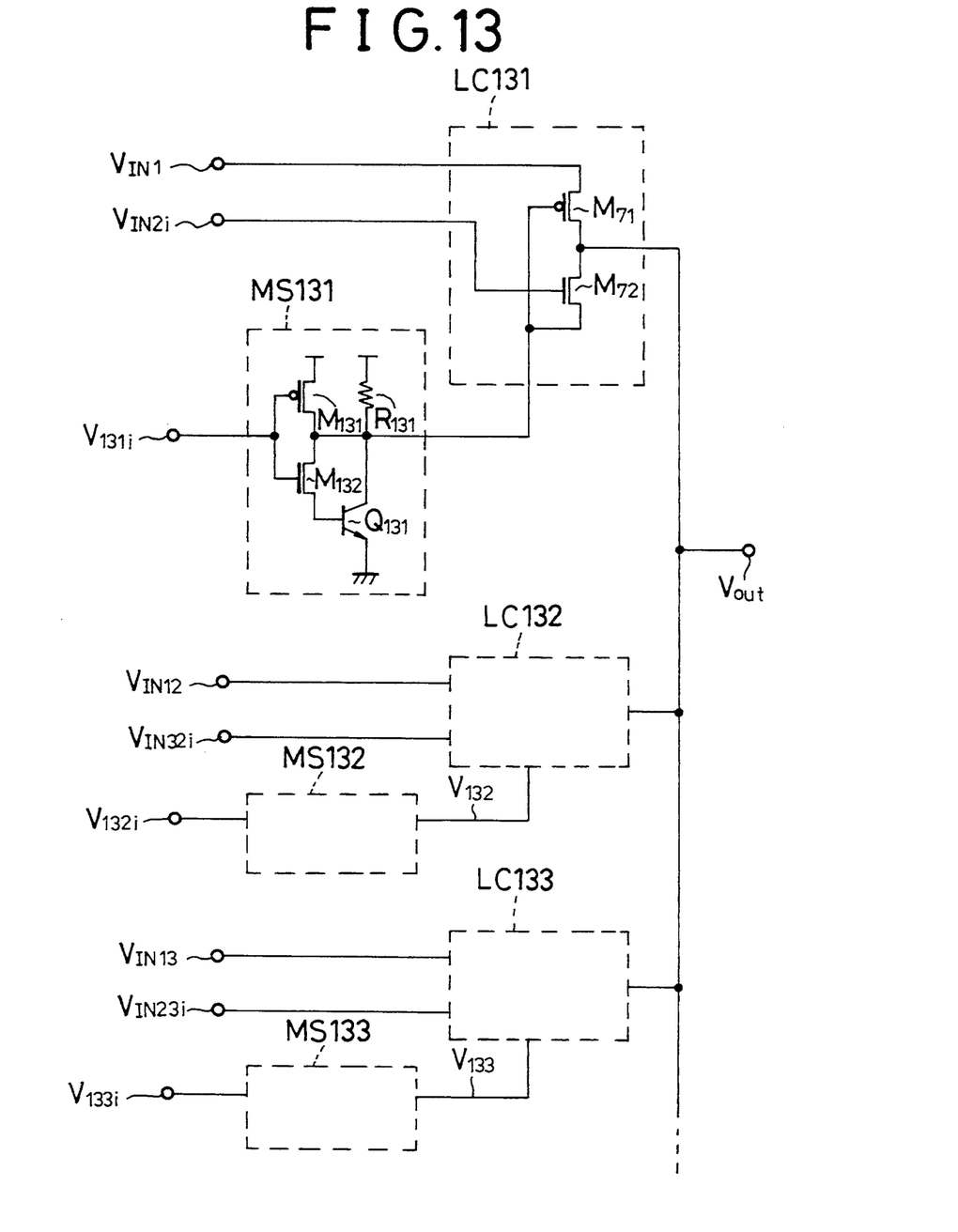
FIG. 13 is a circuit diagram showing an eleventh embodiment of the present invention.

FIG. 13 shows in circuit diagram a semiconductor circuit of a tenth preferred embodiment of the present invention. Referring to FIG. 13, the semiconductor circuit of the present embodiment is formed as a multiplexer which makes use of the characteristics of a semiconductor circuit of the present invention in which PMOS FETs or NMOS FETs can be turned OFF readily and output signal $V_{out}$ can be put into a floating state. The circuit of the embodiment shown in FIG. 6 is employed as amplifier circuit LC131 for a multiplexer. Controlling circuit MS131 for generating constant voltage value $V_{131}$ to be inputted to amplifier circuit LC131 is a controlling circuit for the multiplexer. Circuit MS131 receives input signal $V_{131i}$ at the gates of PMOS FET $M_{131}$ and NMOS FET $M_{132}$, the drains of which are both connected and serve as an output terminal for controlling signal $V_{131}$. While the source voltage to PMOS FET $M_{131}$ is the power supply voltage $V_{CC}$, the source voltage of NMOS FET $M_{132}$ is inputted to the base of bipolar transistor $Q_{131}$. The emitter of transistor $Q_{131}$ is connected to the ground potential GND, and resistor $R_{131}$ is interposed between the power source voltage $V_{CC}$ and the output terminal for signal $V_{131}$. Amplifier circuit LC132 and controlling circuit MS132, amplifier circuit LC133 and controlling circuit MS133, . . . similar to amplifier circuit LC131 and controlling circuit MS131, respectively, are disposed in parallel to each other, and the output terminals for output signals $V_{out}$ are connected in common. If only one of input signals $V_{131i}$, $V_{132i}$, $V_{133i}$, . . . to controlling circuits MS131, MS132, MS133, . . . which is to be selected is put into a high-level state, for example, when signal $V_{131i}$ is put into the high-level state while the remaining signals are all kept in the low-level state, PMOS FET $M_{131}$ in controlling circuit MS131 is turned OFF and NMOS FET $M_{132}$ is turned ON, and consequently, little current flows through transistor $M_{131}$ by way of resistor $R_{131}$ and signal $V_{131i}$ presents the voltage $V_{131i}=V_f=0.8$ V. Since amplifier circuit LC131 to which controlling signal $V_{131}$ is inputted thus has a sufficiently high value as the constant voltage for reference thereto, it amplifies input signals $V_{IN1}$ and $V_{IN2}$ and outputs them to the output terminal for signal $V_{out}$. In this instance, since all the other constant voltages for reference are equal to the power supply potential $V_{CC}$, amplifiers LC132, LC133 . . . present a high-impedance state from the output terminals thereof for output signals $V_{out}$, thereby realizing the function of a multiplexer.

As described so far, according to the present invention, when types or switching operation systems of transistors of the pull-up side and the pull-down side of an amplifier circuit at which input signals are to be received are different from each other, the input signals are inputted at individually level-shifted optimum voltages to the transistors. Further, according to the present invention, a high amplifying capacity, high-speed operation, and low current consumption can be realized by applying constant voltages at suitable values for reference. For example, in a circuit in which a CMOS inverter which employs a PMOS FET of the source driving type as a pull-up transistor and an NMOS FET of the gate driving type as a pull-down transistor is employed as a basic circuit, there is a significant effect in improvement such that the amplification gain is two to five times and the response time/current product is one fifth to one tenth that of conventional circuits.

Further, according to the present invention, the function of a multiplexer circuit or a logic circuit can be easily provided, and additionally, by making use of a constant-voltage signal for reference for the control of an amplifier circuit, there will be no without deterioration of the amplifying effect of the amplifier circuit.

While the invention has been shown and described particularly with reference to preferred embodiments thereof, it will be understood by those skilled in the art that the foregoing and other changes in form and detail may be made without departing from the spirit and scope of the invention.

What is claimed is:

1. A semiconductor circuit for receiving an input signal of a first amplitude and amplifying the input signal into an output signal of a second amplitude that is approximately as high as a power supply voltage powering the semiconductor circuit, comprising:
   a first field effect transistor for receiving a first input signal at the source thereof,
   a second field effect transistor for receiving at the gate thereof a second input signal which is level-shifted from the first input signal; and
   an output circuit electrically connected to the first and second field effect transistors for outputting an output signal in accordance with a difference between the specific conductances of said first and second field effect transistors which vary in accordance with the input signals.

2. The semiconductor circuit as claimed in claim 1, in which said output circuit comprises a current mirror circuit including a pair of field effect transistors having the opposite conductivity to said second field effect transistor,
   one of said pair of field effect transistors of said current mirror circuit for monitoring current being connected to the drain of said second field effect transistor,
   the other of said pair of field effect transistors of said current mirror circuit and said first field effect transistor cooperatively forming a complementary inverter circuit.

3. The semiconductor circuit as claimed in claim 1, in which said output circuit comprises a current mirror circuit including a pair of field effect transistors having the opposite conductivity to said second field effect transistor,
   one of said pair of field effect transistors of said current mirror circuit for monitoring current being connected to the drain of said first field effect transistor,
   the other of said pair of field effect transistors of said current mirror circuit and said second field effect transistor cooperatively forming a complementary inverter circuit.

4. A semiconductor circuit for receiving an input signal of a first amplitude and amplifying the input signal into an output signal of a second amplitude that is approximately as high as a power supply voltage powering the semiconductor circuit, comprising:
   a first field effect transistor which receives a first input signal at the source thereof and receives a first constant reference voltage signal at the gate thereof; and
   a second field effect transistor which has the opposite conductivity to said first field effect transistor and receives at the gate thereof a second input signal having the opposite phase to the first input signal and further receives at the source thereof a second constant reference voltage signal,
   the drains of said first and second field effect transistors being connected to each other to form a complementary inverter circuit, and
   the second input signal being an input signal having the opposite phase to and level-shifted from the first input signal.

5. The semiconductor circuit as claimed in claim 4, wherein a common voltage is used as the first and second constant reference voltages to be applied to the gate of said first field effect transistor and the source of said second field effect transistor.

6. The semiconductor circuit as claimed in either claim 4 or 5, further comprising means for turning one or both of said first and second field effect transistors off substantially completely when the circuit is not in operation by varying at least one of the first and second constant reference voltage signals.

7. The semiconductor circuit as claimed in claim 6, further comprising an element for receiving a constant reference voltage signal as a controlling signal and providing an output corresponding to the controlling signal, whereby said semiconductor circuit has an additional function as a logic circuit.

8. The semiconductor circuit as claimed in claim 6, further comprising a plurality of semiconductor circuits having the same construction as said semiconductor circuit, the outputs of all of the semiconductor circuits being connected in common to form a multiplexer circuit.

9. A semiconductor circuit as claimed in any one of claims 1 to 5 employed as a level-shifting circuit for amplifying a signal from an ECL input level to approximately the power supply voltage for CMOS or TTL.

10. A semiconductor circuit as claimed in claim 6 employed as a level-shifting circuit for amplifying a signal from an ECL input level to approximately the power supply voltage for CMOS or TTL.

11. A semiconductor circuit as claimed in claim 7 employed as a level-shifting circuit for amplifying a signal from an ECL input level to approximately the power supply voltage for CMOS or TTL.

12. A semiconductor circuit as claimed in claim 8 employed as a level-shifting circuit for amplifying a signal from an ECL input level to approximately the power supply voltage for CMOS or TTL.

13. A semiconductor circuit, wherein the semiconductor circuit as claimed in any one of claims 1 to 5 is employed as a sensing amplifier circuit which amplifies a signal from an internal low voltage which is approximately as high as the ECL level to approximately the power supply voltage for the TTL level output.

14. A semiconductor circuit, wherein the semiconductor circuit as claimed in claim 6 is employed as a sensing amplifier circuit which amplifies a signal from an internal low voltage which is approximately as high as the ECL level to approximately the power supply voltage for the TTL level output.

15. A semiconductor circuit, wherein the semiconductor circuit as claimed in claim 7 is employed as a sensing amplifier circuit which amplifies a signal from an internal low voltage which is approximately as high as the ECL level to approximately the power supply voltage for the TTL level output.

16. A semiconductor circuit, wherein the semiconductor circuit as claimed in claim 8 is employed as a sensing amplifier circuit which amplifies a signal from an internal low voltage which is approximately as high as the ECL level to approximately the power supply voltage for the TTL level output.

17. A semiconductor circuit, wherein the semiconductor circuit as claimed in any one of claims 1 to 5 is employed as an output buffer circuit for driving an output transistor.

18. A semiconductor circuit, wherein the semiconductor circuit as claimed in claim 6 is employed as an output buffer circuit for driving an output transistor.

19. A semiconductor circuit, wherein the semiconductor circuit as claimed in claim 7 is employed as an output buffer circuit for driving an output transistor.

20. A semiconductor circuit, wherein the semiconductor circuit as claimed in claim 8 is employed as an output buffer circuit for driving an output transistor.

* * * * *

UNITED STATES PATENT AND TRADEMARK OFFICE
CERTIFICATE OF CORRECTION

PATENT NO. : 5,382,845
DATED : January 17, 1995
INVENTOR(S) : Takahashi

It is certified that error appears in the above-indentified patent and that said Letters Patent is hereby corrected as shown below:

Col. 11, line 50 delete "$M_{11}$" insert -- $M_{111}$ --

Col. 11, line 54 delete "$M_{11}$" insert -- $M_{111}$ --

Signed and Sealed this

Twenty-third Day of May, 1995

Attest:

BRUCE LEHMAN

Attesting Officer        Commissioner of Patents and Trademarks